(12) United States Patent
Hasegawa et al.

(10) Patent No.: US 11,337,316 B2
(45) Date of Patent: May 17, 2022

(54) LAMINATE, METHOD FOR PRODUCING THE SAME, AND METHOD FOR FORMING CONDUCTIVE PATTERN

(71) Applicant: NATIONAL INSTITUTE OF ADVANCED INDUSTRIAL SCIENCE AND TECHNOLOGY, Tokyo (JP)

(72) Inventors: Tatsuo Hasegawa, Tokyo (JP); Toshikazu Yamada, Ibaraki (JP); Ken Matsuoka, Ibaraki (JP); Ayano Katou, Ibaraki (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 248 days.

(21) Appl. No.: 16/179,511

(22) Filed: Nov. 2, 2018

(65) Prior Publication Data

US 2019/0098767 A1    Mar. 28, 2019

Related U.S. Application Data

(62) Division of application No. 14/199,306, filed on Mar. 6, 2014, now abandoned.

(30) Foreign Application Priority Data

Mar. 7, 2013 (JP) ................ 2013-045173
Aug. 29, 2013 (JP) ................ 2013-177676
Sep. 10, 2013 (JP) ................ 2013-186922

(51) Int. Cl.
*H05K 3/38* (2006.01)
*H05K 3/12* (2006.01)
(Continued)

(52) U.S. Cl.
CPC ............. *H05K 3/386* (2013.01); *H05K 1/034* (2013.01); *H05K 1/095* (2013.01); *H05K 1/097* (2013.01);
(Continued)

(58) Field of Classification Search
CPC .................................... H05K 3/386
See application file for complete search history.

(56) References Cited

U.S. PATENT DOCUMENTS 5,225,272 A   7/1993  Poole et al.
6,130,175 A   10/2000 Rusch et al.
(Continued)

FOREIGN PATENT DOCUMENTS

JP   2003-124215   4/2003
JP   2004-111818   4/2004
(Continued)

OTHER PUBLICATIONS

Yamada et al., "Convenient Printing Process for High Resolution Metal Patterning with Silver Nanoinks," Japan Society of Applied Physics, Mar. 11, 2013; along with an English translation thereof.
(Continued)

*Primary Examiner* — Austin Murata
(74) *Attorney, Agent, or Firm* — Greenblum & Bernstein, P.L.C.

(57) ABSTRACT

A laminate that includes a metal layer that is not easily separated from a substrate, a method for producing the laminate, and a method for forming a fine conductive pattern that exhibits high conductivity, are disclosed. The peel strength of a metal layer included in a laminate that includes a polymer layer provided between a substrate and the metal layer is improved by implementing a structure in which the metal that forms the metal layer is chemically bonded to COO that extends from the polymer main chain that forms
(Continued)

the polymer layer at the interface between the metal layer and the polymer layer. A fine conductive pattern that exhibits high conductivity can be formed by applying UV light to a pattern area of an insulating film formed on a substrate, and applying an ink prepared by dispersing metal nanoparticles in a solvent to the substrate to effect adhesion and aggregation of the ink in the pattern area, the surface of the metal nanoparticles being protected by an organic molecule layer.

8 Claims, 8 Drawing Sheets

(51) Int. Cl.
 *H05K 1/09* (2006.01)
 *H05K 1/03* (2006.01)
(52) U.S. Cl.
 CPC ..... *H05K 3/1208* (2013.01); *H05K 2201/015* (2013.01); *H05K 2201/0145* (2013.01); *H05K 2201/0317* (2013.01); *H05K 2203/0139* (2013.01); *H05K 2203/0143* (2013.01); *H05K 2203/0522* (2013.01); *Y10T 428/31678* (2015.04)

(56) References Cited

U.S. PATENT DOCUMENTS

| | | | |
|---|---|---|---|
| 6,680,124 | B1 | 1/2004 | Araki et al. |
| 2002/0081921 | A1 | 6/2002 | Vargo et al. |
| 2002/0109903 | A1 | 8/2002 | Kaeriyama et al. |
| 2003/0188958 | A1 | 10/2003 | Chason et al. |
| 2005/0078158 | A1 | 4/2005 | Magdassi et al. |
| 2008/0014530 | A1* | 1/2008 | Kawamura ............ B82Y 30/00 430/270.1 |
| 2008/0193668 | A1 | 8/2008 | Mevellec et al. |
| 2009/0029148 | A1 | 1/2009 | Hashimoto et al. |
| 2009/0035565 | A1 | 2/2009 | Serbutoviez et al. |
| 2012/0043510 | A1 | 2/2012 | Kurihara et al. |
| 2013/0334470 | A1 | 12/2013 | Kurihara et al. |

FOREIGN PATENT DOCUMENTS

| | | |
|---|---|---|
| JP | 2005-289054 | 10/2005 |
| JP | 2010-265543 | 11/2010 |
| JP | 2012-96225 | 5/2012 |
| JP | 2012-162767 | 8/2012 |

OTHER PUBLICATIONS

Minemawari et al., "Inkjet printing of single-crystal films," Nature, vol. 475, 2011, pp. 364-367.

Fukuda et al., "Organic integrated circuits using room-temperature sintered silver nanoparticles as printed electrodes," Organic Electronics, vol. 13, 2012, pp. 3296-3301.

Itoh et al., "Direct Transformation into Silver Nanoparticles via Thermal Decomposition of Oxalate-Bridging Silver Oleylamine Complexes," J. Nanosci. Nanotechnol., vol. 9, No. 6, 2009, pp. 1-6.

Japanese Office Action in respect to Japanese Application No. 2013-186922, dated Feb. 3, 2017.

"Nippon Paint", IBCC, dated February 14, 2017, pp. 1-2

* cited by examiner

FIG. 1 0 A
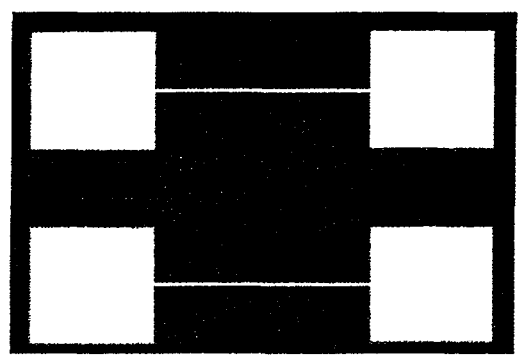
FIG. 1 0 B
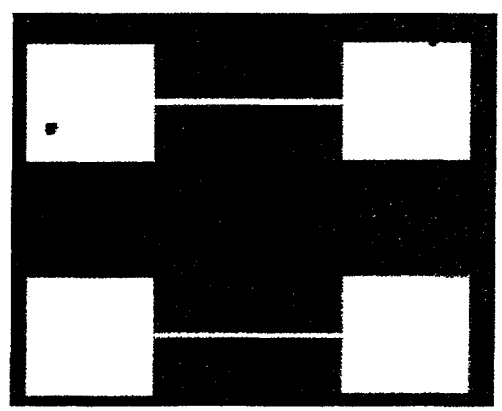

LAMINATE, METHOD FOR PRODUCING THE SAME, AND METHOD FOR FORMING CONDUCTIVE PATTERN

The present application is a Divisional Application of U.S. application Ser. No. 14/199,306, filed on Mar. 6, 2014, which claims priority to Japanese Application No. 2013-186922 filed on Sep. 10, 2013, Japanese Application No. 2013-177676 filed on Aug. 29, 2013 and Japanese Application No. 2013-045173 filed on Mar. 7, 2013. The disclosures of U.S. application Ser. No. 14/199,306 are incorporated by reference herein in their entireties.

BACKGROUND OF THE INVENTION

Field of the Invention

The invention relates to a laminate that includes a metal layer, and a method for producing the same. More specifically, the invention relates to articles for which it is desired that a metal layer strongly adhere to a substrate (e.g., daily commodities having an antifungal function or an antibacterial function), and electrical parts having a laminate structure (e.g., conductive film, wire, and electrode).

The invention also relates to a method for forming a conductive pattern by applying a metal nanoparticle ink to implement a fine (high-resolution) wiring pattern or the like.

Discussion of the Background

In recent years, development of a technique for producing an electronic device (e.g., display or sensor) that utilizes a flexible substrate having a reduced weight and an increased area as a base substrate has been desired in the electronics field. For example, a technique for producing electronic parts for an organic EL display, a liquid crystal panel, a large-area pressure sensor, an active backplane, a touch screen, and the like using a plastic substrate (e.g., polyimide or polyethylene naphthalate) having a small thickness (1 to 100 µm) as a base substrate has been under development.

Such electronic parts have been produced by forming thin-film layers (e.g., metal layer, semiconductor layer, and insulating layer) on a hard solid substrate (e.g., glass substrate or silicon substrate), and patterning the thin-film layers to integrate electronic devices (e.g., thin film transistors). In this case, since the substrate is hard and is not deformed, a major problem does not occur even if the metal layer or the like may be easily separated from the substrate.

However, when producing an electronic device using a flexible substrate (e.g., plastic film), the electronic device may deteriorate, break down, or be damaged when the metal layer is separated from the substrate, or breaks due to deformation or bending. Therefore, it has been a major technical problem to prevent such a situation to improve durability.

A thin active metal layer is generally formed on the surface of toilet things or the wall surface of a bathroom, a powder room, or the like in order to provide an antifungal function or an antibacterial function. In this case, it is desired that the metal layer not be easily removed from the surface of the substrate in order to maintain the antifungal function or antibacterial function for a long time.

A fine conductive circuit pattern having a large area has been desired in the field of electronic devices (e.g., semiconductor device or display). The conductive circuit pattern has been formed by forming a metal thin film using an evaporation method (vapor deposition), a sputtering method, a plating method, a coating method, or the like, and patterning the metal thin film using a mask or lithography.

For example, an organic semiconductor device is a promising large-area flexible electronic device since a large-area electronic device can be formed using a thin film, and a high-temperature process is not required during the production process (i.e., a plastic substrate can be used). In order to effectively utilize the above advantages, a technique that forms a conductive circuit pattern of the organic semiconductor device using a coating method has been proposed.

A nanometal ink prepared by protecting the surface of highly active metal nanoparticles (e.g., silver nanoparticles) using an organic molecule layer, and dispersing the metal nanoparticles in a solvent has been under development as a conductive ink forming a conductive circuit pattern (see Patent Documents 1 and 2 and Non-patent Document 1).

Patent Document 1 discloses coated silver nanoparticles as a conductive material that has a low-temperature sintering capability and can be applied to even a flexible substrate having low heat resistance. The coated silver nanoparticles disclosed in Patent Document 1 have a particle size of 30 nm or less, and are covered with protective amine molecules. Patent Document 1 discloses that the protective amine molecules include a medium/short-chain alkylamine having a boiling point of 100 to 250° C., and a medium/short-chain alklydiamine having a boiling point of 100 to 250° C. as the main components.

Patent Document 1 discloses a phenomenon that coated silver nanoparticles are sintered to form a silver thin film on the substrate by applying a dispersion prepared by dispersing the coated silver nanoparticles in an appropriate volatile dispersion medium to a desired substrate using a spin coating method or an inkjet method; and exposing the substrate to an appropriate temperature equal to or less than 120° C. to volatilize the dispersion medium, and dissociate the amine that forms the protective film that covers the coated silver nanoparticles. Patent Document 1 states that the above phenomenon makes it possible to form a metal thin film on a desired substrate by printing using a dispersion prepared by dispersing the coated silver nanoparticles in an appropriate dispersion medium as an ink.

Patent Document 2 discloses coated metal nonparticles that can be smoothly produced by a metal amine complex decomposition method, and can be smoothly sintered at a low temperature. Patent Document 2 discloses that the coated metal nanoparticles are coated with a film that includes an alkylamine. Patent Document 2 discloses that it is preferable that the coating include an alkylamine having 5 or less carbon atoms, the weight ratio of the coating in the coated metal nanoparticles be 20 wt % or less, the average particle size of the coated metal nanoparticles be 30 nm or less, and the coated metal nanoparticles include silver as the main component. Patent Document 2 also discloses that copper or nickel may be used instead of silver.

Patent Document 2 discloses dispersing the coated metal nanoparticles produced by a metal amine complex decomposition method in an organic solvent to prepare an ink having a high concentration, or mixing the coated metal nanoparticles with a binder to prepare a paste, and also discloses that it is desirable to use an alkylamine, an alkyldiamine, or the like in which the amino group is bonded to the alkyl group when sintering the coated metal nanoparticles at a low temperature. Patent Document 2 discloses that an alkylamine, an alkyldiamine, and an amine having another structure may be used as the amine.

Patent Document 2 discloses forming a metal wiring pattern by an inkjet method using a coated metal nanoparticle dispersion prepared by dispersing the coated metal nanoparticles in an organic solvent in a weight ratio of preferably 30 wt % or more.

Non-patent Document 2 further discloses forming a metal wiring pattern in an area subjected to a plasma treatment using a dispenser.

A pattern-forming method has been known that subjects the surface of a substrate to hydrophilic/hydrophobic surface patterning with different surface energy to control a phenomenon in which the material solution spreads.

For example, Patent Document 3 discloses a pattern-forming method that includes a step that forms a first area and a second area on the surface of a substrate, and a step that supplies a pattern-forming material to the substrate to selectively form a pattern in the first area, the first area having surface properties that allow the pattern-forming material to be preferentially deposited, and the second area having surface properties that allow the pattern-forming material to be deposited to only a small extent as compared with the first area. The pattern-forming material is a solution that includes metal particles (e.g., platinum, gold, or silver particles) having a diameter of 100 nm or less, and is supplied to the substrate in a liquid state. In Patent Document 3, the surface properties of the substrate are provided with selectivity by forming a surface-modifying film on the substrate using a silane coupling agent or the like, and applying light to the surface-modifying film in the first area to decompose and remove the surface-modifying film. In Patent Document 3, the pattern-forming material is supplied to the substrate in a liquid state using a mist deposition method.

Patent Document 4 discloses a technique that forms a fluororesin film on the surface of a substrate, physically removes the fluororesin film by applying patterned UV light to the fluororesin film to form a hydrophilic/hydrophobic pattern, and applies a conductive material solution to the hydrophilic/hydrophobic pattern to form a conductive circuit pattern.

Non-patent Document 3 discloses a technique that subjects a thermally oxidized silicon substrate to a self-assembly monomolecular film treatment to form a hydrophobic surface, forming a hydrophilic pattern area by applying UV light, and drops an ink in which an organic semiconductor is dissolved, and an ink that promotes deposition onto the inside of the hydrophilic pattern using an inkjet method.

RELATED-ART DOCUMENT

Patent Document

Patent document 1: JP-A-2010-265543
Patent Document 2: JP-A-2012-162767
Patent Document 3: JP-A-2004-111818
Patent Document 4: JP-A-2003-124215

Non-patent Document

Non-patent Document 1: Kurihara et al., J. Nanosci. Nanotechnol. 9, pp. 6655-6660 (2009)
Non-patent Document 2: Fukuda et al., Organic Electronics, vol. 13, pp. 3296-3301 (2012)
Non-patent Document 3: Minemawari, Yamada, Hasegawa, et al., Nature, vol. 475, pp. 364-367 (2011)

SUMMARY OF THE INVENTION

A metal layer has been normally formed on a substrate using a vacuum evaporation method, a coating method, or the like. However, since the atoms are not chemically bonded (i.e., the layers merely come in physical contact with each other) at the interface between the substrate and the metal layer, it has been difficult to prevent the metal layer from being separated from the surface of the substrate.

When forming a metal layer on a substrate using a sputtering method, metal particles are caused to collide with the surface of the substrate to roughen the surface of the substrate, and a metal layer is formed thereon. Therefore, the resulting metal layer is not easily separated from the surface of the substrate as compared with the case of using a vacuum evaporation method, a coating method, or the like. However, adhesion of the metal layer formed using a sputtering method is not necessarily sufficient in applications in which a metal layer is formed on a plastic film or the surface of a toilet thing or the like.

In order to produce flexible electronic devices, daily commodities having an antibacterial function, and the like, it is necessary to develop a technique that can form a metal thin film/wire/electrode that are not easily separated from various substrates. However, a metal layer that is physically adsorbed on a substrate does not necessarily exhibit sufficient adhesion to the substrate (i.e., may be easily separated from the substrate) (see above).

When forming a pattern using a known application step, it is necessary to form a resist film on a substrate, and perform a lithographic process. As a result, the process may become complex, or a deterioration in substrate quality/circuit elements may occur due to a number of steps.

When forming a conductive pattern using a dispersion (ink) prepared by dispersing metal nanoparticles coated with protective amine molecules in a dispersion medium (see Patent Documents 1 and 2 and Non-patent Document 1), it is important to ensure the ink stability (excellent dispersibility) and the low-temperature aggregation/fusion capability (low baking (calcining) temperature) after application that have a trade-off relationship.

In Patent Documents 1 and 2, an ink is applied to a desired substrate using a spin coating method or an inkjet method. However, since it is difficult to achieve sufficient aggregation of the metal nanoparticles and a sufficient film thickness using these methods, it may be difficult to implement the desired conductivity.

An inkjet printing method, a reverse printing method, a μ-contact printing method, or the like may be used as a metal nanoparticle printing method. However, since these printing methods may require a number of steps, or may require development of special equipment, a more convenient method is desired for industrial applications. Moreover, it is difficult to produce a fine metal wiring pattern having a large area using these printing methods.

When employing a method that forms a hydrophilic/hydrophobic pattern with different surface energy on the surface of a substrate (see Patent Document 3), it is necessary to supply a small amount of ink to each pattern area in order to form a fine conductive pattern. As a result, the process becomes complex, for example. Specifically, the surface energy of ink droplets becomes predominant as the degree of fineness (resolution) increases, and it is impossible to achieve spontaneous formation of a pattern by utilizing only the difference in surface energy on the surface of the substrate.

In Non-patent Document 3 in which an organic single-crystal thin film is formed only an area inside the pattern area to form an organic semiconductor pattern, a hydrophilic/hydrophobic pattern consisting of a hydrophilic area and a hydrophobic area is used. However, the technique disclosed in Non-patent Document 3 has problems in that it is necessary to supply an ink to only the hydrophilic area, and it is necessary to form each pattern one by one.

The invention was conceived in order to solve the above technical problems. An object of the invention is to provide a laminate that includes a metal layer that is not easily separated from a substrate. Another object of the invention is to provide a laminate in which a metal layer is strongly chemically bonded to a polymer layer. Another object of the invention is to provide a method for producing a laminate in which a metal layer is strongly chemically bonded to a polymer layer.

Another object of the invention is to provide a method for forming a conductive pattern using a dispersion (ink) prepared by dispersing silver nanoparticles coated with protective amine molecules in a dispersion medium. A further object of the invention is to provide a fine conductive pattern having high conductivity using the above method.

Several aspects of the invention achieve the above objects by providing the following features.

According to one aspect of the invention, a laminate includes a metal layer that is chemically bonded to COO extending from a polymer main chain of a polymer layer. According to one aspect of the invention, a laminate includes a substrate, a metal layer, and a polymer layer provided between the substrate and the metal layer, a metal of the metal layer being chemically bonded to COO extending from a polymer main chain of the polymer layer at an interface between the metal layer and the polymer layer.

The polymer layer is preferably formed of a fluorine-based polymer. The metal layer is formed of one or more metals among silver, gold, platinum, iron, copper, tin, zinc, lead, aluminum, magnesium, nickel, chromium, and manganese, or an alloy thereof, for example. It is preferable to use silver, gold, copper, chromium, nickel, manganese, or aluminum from the viewpoint of adhesion and the like, for example. The metal layer may be a metal layer in which metal nanoparticles aggregate, for example. The metal layer may be an evaporated layer, for example.

According to one aspect of the invention, a method for producing a laminate includes a treatment step that causes a polymer layer formed on a substrate to have a reactive surface, and a metal layer-forming step that forms a metal layer on the reactive surface so that the polymer layer is chemically bonded to the metal layer.

The treatment step that causes the polymer layer to have the reactive surface may be a step that applies light to the polymer layer, for example. In this case, UV light may be applied to the polymer layer, for example. Note that light other than UV light may be applied to the polymer layer as long as the reactive surface (e.g., carboxyl groups) can be formed that allows the polymer layer to be chemically bonded to the metal layer.

The metal layer may be formed using an arbitrary method. The metal layer may be formed using a known metal layer-forming method. For example, light is applied to the polymer layer formed on the substrate, and the metal layer is formed by evaporation so that the polymer layer is chemically bonded to the metal layer. Alternatively, light is applied to the polymer layer formed on the substrate, and an ink prepared by dispersing the metal nanoparticles in a solvent is applied to the polymer layer so that the polymer layer is chemically bonded to the metal layer. The ink may be prepared using metal nanoparticles provided with a coating layer or metal nanoparticles that are not provided with a coating layer. The ink may be applied using a known application (coating) method.

A pattern area (reactive surface) may be formed on the surface of the polymer layer, and the metal layer may be formed on only the pattern area by evaporation or application of the ink. Since the reactive surface can be formed by applying light to only a specific area, a metal film can caused to adhere to only the pattern area. The ink may be applied to the pattern area using a normal coating method. For example, the ink may be caused to adhere to and aggregate on only the pattern area using a blade coater, a roll coater, a slit coater, or the like.

According to one aspect of the invention, a method for forming a conductive pattern includes applying UV light to a pattern area of an insulating film formed on a substrate, and applying an ink prepared by dispersing metal nanoparticles in a solvent to the substrate to effect adhesion and aggregation of the ink in the pattern area, a surface of the metal nanoparticles being protected by an organic molecule layer. It is preferable that the organic molecule layer include an alkylamine, an alkyldiamine, or an amine having another structure.

It is preferable to apply the ink using an application member that holds the ink in a gap or a contact area with the substrate. It is preferable to apply the ink using a blade. For example, the ink may be supplied to the substrate through a slit-like discharge mechanism provided to the application member. It is also preferable to apply the ink using a roll. It is preferable that the insulating film be formed of a fluorine-based resin. It is preferable that the pattern area to which the UV light has been applied has a reactive surface in which radicals have been generated through a photochemical reaction.

It is preferable to apply UV light having a wavelength of 10 to 250 nm. It is preferable to set the sweep speed of the blade relative to the substrate to 10 mm/sec or less.

According to several aspects of the invention, the metal layer is strongly bonded to the substrate (i.e., it is possible to implement a metal layer that is not easily removed from a substrate). According to several aspects of the invention, the peel strength of the metal layer included in the laminate that includes the polymer layer provided between the substrate and the metal layer is improved by implementing a structure in which the metal that forms the metal layer is chemically bonded to COO extending from the polymer main chain of the polymer layer at the interface between the metal layer and the polymer layer. The peel strength of the metal layer may be 5.6 kg/cm$^2$ or more.

According to several aspects of the invention, since the metal layer selectively adheres to only the reactive surface, it is possible to form a metal layer that strongly adheres to only the pattern area.

According to several aspects of the invention, since the ink adheres to only the area to which UV light is applied, and does not adhere to the remaining area, a conductive pattern can be formed by merely applying the ink. Therefore, a fine conductive circuit pattern that exhibits excellent conductivity can be formed using a very simple printing method. According to several aspects of the invention, a conductive circuit pattern having a minimum line width of 5 μm or less and a resolution of 200 ppi or more can be produced in high yield. According to several aspects of the invention, a fine conductive circuit pattern having a minimum line width (pitch) of 0.2 μm can be formed using only a coating method.

According to several aspects of the invention, since the ink supplied from the application member (e.g., blade or roll) selectively adheres to and aggregates on only the reactive surface, it is unnecessary to remove the ink from the substrate (i.e., the ink can be effectively utilized). Since the ink is applied by moving the blade, the roll, or the like relative to the substrate, the method According to several aspects of the invention is suitable for forming a large-area conductive circuit pattern. For example, a conductive circuit pattern can be formed by printing on the surface of a substrate having dimensions of about 1×1 m using 1 ml (minimum) of the nanometal ink. Therefore, the ink can be effectively utilized, and the production efficiency is improved.

According to several aspects of the invention, a metal layer having a uniform thickness can be formed by sweeping the blade or relatively moving the roll at a specific (constant) low speed. The thickness of the metal layer can be adjusted to the desired value by changing the concentration of the ink.

A conductive pattern having the desired degree of fineness can be formed by optimizing the relative moving speed (e.g., sweep speed) and the environment (e.g., temperature and humidity) during the application step. According to several aspects of the invention, it is possible to produce a highly conductive pattern having a volume resistivity equal to about 3 to 60 times the volume resistivity of the metal included in the metal nanoparticle ink. According to several aspects of the invention, it is possible to produce a conductive pattern having a volume resistivity equal to or less than 3 times the volume resistivity of the metal included in the metal nanoparticle ink by optimizing the metal nanoparticle production conditions.

Metal nanoparticles protected by an alkanethiol group (protective molecule) have been normally used to prepare an ink. However, since the thiol group and the metal are strongly bonded, the protective molecules are strongly bonded to the metal, and easily dispersed in the solvent. According to several aspects of the invention, since an amine that is weakly bonded to a metal is used as the protective molecule that covers the metal nanoparticles, adhesion and aggregation of the metal nanoparticles easily occur during application, and a fine conductive pattern can be formed.

BRIEF DESCRIPTION OF THE DRAWINGS

FIG. 10A is a view showing an optical micrograph of a conductive circuit pattern (conductive circuit pattern obtained by capillary coating (fourth embodiment)); FIG. 10B is a view showing an optical micrograph of a conductive circuit pattern (conductive circuit pattern obtained by roll coating (fifth embodiment)).

DESCRIPTION OF THE EMBODIMENTS

[A Laminate]

A laminate according to one embodiment of the invention is described below.

Figure 1:
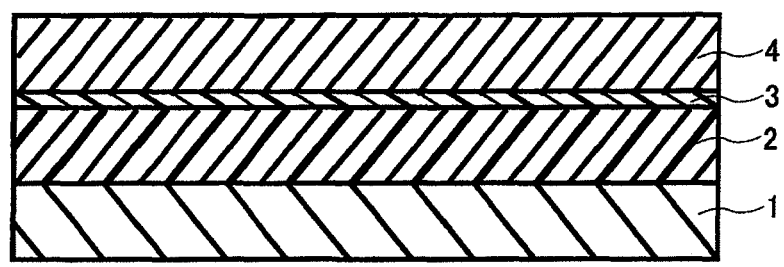
FIG. 1 is a schematic view illustrating one embodiment of the invention (laminate).

The laminate according to one embodiment of the invention has a configuration in which a polymer layer and a metal layer are strongly chemically bonded to suppress separation of the metal layer. The laminate according to one embodiment of the invention is described below with reference to FIGS. 1 and 2. FIG. 1 is a view schematically illustrating the laminate according to one embodiment of the invention. The laminate according to one embodiment of the invention includes a laminate (stacked) structure that includes at least a substrate 1, a polymer layer 2, and a metal layer 4. The metal layer 4 is strongly bonded to the polymer layer 2 through a surface reactive layer 3 that forms the surface (hereinafter referred to as "reactive surface") of the polymer layer 2.

Figure 2:
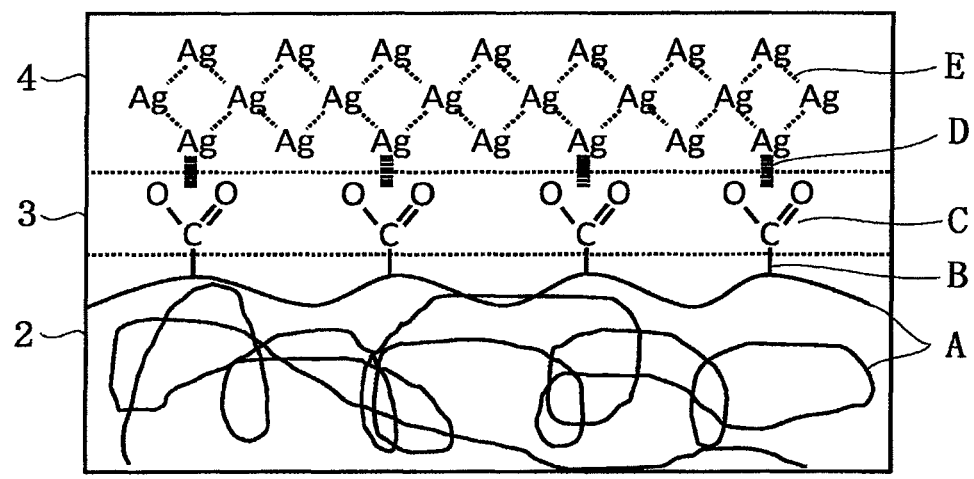
FIG. 2 is a schematic view illustrating one embodiment of the invention (laminate).

FIG. 2 is a schematic view illustrating the chemical bonding state of each layer included in the laminate illustrated in FIG. 1. COO (reference sign C) derived from carboxylic acids (carboxyl groups) that extend from the polymer main chain (reference sign A) included in the polymer layer 2 forms a coordination bond (sign D) with metal atoms included in the metal layer 4 (FIG. 2 illustrates an example in which the metal is silver). The metal atoms included in the metal layer 4 form a metallic bond (reference sign E), and COO (reference sign C) derived from the carboxylic acids (carboxyl groups) forms a covalent bond (reference sign B) with the polymer main chain (reference sign A).

The laminate according to one embodiment of the invention is obtained by causing the polymer layer (e.g., fluorine-based polymer layer) formed on the substrate to have the reactive surface by irradiation or the like, and forming the metal layer on the polymer layer using a metal thin film-forming technique (e.g., vacuum evaporation (deposition) method or coating method).

The polymer layer subjected to irradiation or the like is provided with the reactive surface through a photochemical reaction. The term "reactive surface" used herein refers to a state in which the surface of the polymer layer (e.g., per-fluororesin) includes carboxylic acids (carboxyl groups) produced through a photochemical reaction upon irradiation, and a strong coordination bond is easily formed with a metal. The polymer layer is preferably an amorphous fluoropolymer resin layer. The reactive surface may be a surface that includes COO derived from carboxylic acids (carboxyl groups) produced through generation of radicals due to a photochemical reaction upon UV irradiation.

The lower limit and the upper limit of the UV wavelength range employed when causing a photochemical reaction to occur for forming the reactive surface are preferably 10 nm and 250 nm, respectively. For example, the C—F bond energy is about 490 kJ/mol. Therefore, it is considered that dissociation sufficiently occurs when the UV wavelength is 244 nm or less. For example, it is preferable to use vacuum ultraviolet (VUV) light. The term "vacuum ultraviolet light" or "VUV light" refers to UV light having a wavelength of about 10 nm to about 200 nm. The lower limit of the UV wavelength is more preferably 100 nm. The irradiation power (dose) is preferably about 10 mJ/cm$^2$ to about 1000 mJ/cm$^2$.

The metal layer may be caused to adhere to the entire substrate, or may be caused to adhere to part of the substrate. The metal layer may be formed on part of the substrate by applying UV light through a photomask that adheres to the polymer layer formed on the substrate and covers an area other than the desired pattern area. The pattern may be formed by sweeping a UV laser beam having a reduced beam diameter over the substrate. Alternatively, patterned parallel UV light may be applied to the substrate without causing a photomask to adhere to the polymer layer.

The substrate may be a plastic substrate that has low heat resistance (e.g., polyethylene naphthalate (PEN), polyethylene terephthalate (PET), or polypropylene), a plastic substrate that has high heat resistance (e.g., polycarbonate), a silicon substrate, a glass substrate, or the like. It is preferable to use a plastic substrate when producing a flexible electronic device. A pulp substrate impregnated with a fluororesin may also be used. The shape and the structure of the substrate are not particularly limited. The substrate may have a planar shape or a curved shape.

The laminate according to one embodiment of the invention may be applied to an electrical product, for example. Specific examples of the electrical product include a wire, an electrode, a conductive pattern, a flexible electronic device, a semiconductor device, and the like. The laminate according to one embodiment of the invention may also be applied to an article other than the electrical product. Examples of such an article include daily commodities for which an antibacterial function is useful (e.g., mirror, bathroom furnishings, toilet things, desk, chair, mouse, and keyboard).

The metal layer included in the laminate according to one embodiment of the invention is particularly effective for a nanolaminate structure having a thickness of about 2 nm to about 200 nm, for example. The nanolaminate structure may have a thickness of 200 nm or more.

The polymer layer used for the laminate according to one embodiment of the invention may be formed using a fluorine-based polymer. The fluorine-based polymer functions as an insulating film. It is preferable that the surface of the insulating film be smooth and flat. Since the insulating film must generate radicals through a photochemical reaction upon application of UV light, it is preferable to use a polymer insulating material (e.g., fluorine-based resin) that generates reactive radicals.

Examples of the fluorine-based resin include polychlorotrifluoroethylene, polyvinyl fluoride, an ethylene-chlorotrifluoroethylene copolymer, polyvinylidene fluoride, a perfluoroethylenepropene copolymer, an ethylene-tetrafluoroethylene copolymer, polytetrafluoroethylene, a perfluoroalkoxyalkane, a fluorine-based resin having a perfluoroalkyl ether ring structure, and the like.

The fluorine-based polymer may be a perfluororesin. It is preferable to use a fluorine-based resin having a perfluoroalkyl ether ring structure. Examples of the fluorine-based resin having a perfluoroalkyl ether ring structure include a perfluoro(3-butenyl vinyl ether) polymer ("CYTOP (registered trademark)" manufactured by Asahi Glass Co., Ltd.), and a perfluorodimethyldioxole-tetrafluoroethylene copolymer ("Teflon (registered trademark) AF" manufactured by Dupont-Mitsui Fluorochemicals Co., Ltd.). It is preferable that the polymer layer have an amorphous structure.

The surface of the metal nanoparticles may be protected by an organic molecule layer that includes an alkylamine, an alkyldiamine, or an amine having another structure, or may be protected by another organic molecule layer. The surface of the metal nanoparticles may not be protected by an organic molecule layer. In one embodiment of the invention, an ink prepared by dispersing the metal nanoparticles in a solvent is applied to the reactive surface using a blade or the like to cause the ink to adhere to and aggregate on the reactive surface.

Since the reactive surface has a capability to form a strong coordination bond with the metal layer, removal of the organic molecule layer (protective layer) that includes an alkylamine, an alkyldiarnine, or an amine having another structure, and adheres to the surface of the metal nanoparticles is promoted when the metal nanoparticle ink is applied to the reactive surface after treating the polymer layer formed on the substrate to have the reactive surface, and adhesion and aggregation (fusion and aggregation) of the metal nanoparticles are promoted. Aggregates of the metal nanoparticle ink thus obtained strongly adhere to the substrate through the polymer layer.

Note that the expression "adhesion and aggregation" or "fusion and aggregation" used herein refers to a state in which the metal nanoparticles adhere (fuse) to the substrate (insulating film) while forming aggregates.

When using metal nanoparticles protected by an organic molecule layer (protective layer) that includes an alkylamine, an alkyldiamine, or an amine having another structure, it is considered that a number of alkylamine molecules are bonded to the metal nanoparticles through a coordination bond formed by the amino group, and the alkyl moieties aggregate on the surface of the metal nanoparticles so that the metal nanoparticles are coated with the organic molecule layer. Therefore, the weight ratio of the coating can be mainly adjusted by adjusting the molecular weight of the alkylamine.

When using coated silver nanoparticles as the coated metal nanoparticles, the metal nanoparticles may include silver as the main component, and further include an additional metal element. The coated metal nanoparticles may be formed of copper or nickel instead of silver. The coated metal nanoparticles are nanometer-sized particles having a particle size of less than 1 μm. The average particle size of the coated metal nanoparticles is preferably 10 to 100 nm, and more preferably 10 to 30 nm.

[A Method for Forming a Conductive Pattern]

A method for forming a conductive pattern according to one embodiment of the invention is described below.

The method for forming a conductive pattern according to one embodiment of the invention includes applying UV light to only a pattern area of an insulating film formed on a substrate, causing an ink prepared by dispersing metal nanoparticles provided with an organic molecule coating layer in a solvent to adhere to an application member, and moving the application member on the substrate relative to the substrate to form a conductive pattern. According to the above method for forming a conductive pattern, the ink that adheres to the application member adheres to and aggregates on the pattern area by moving the application member relative to the substrate, while the ink does not adhere to an area other than the pattern area. It is preferable to use an ink prepared by dispersing metal nanoparticles of which the surface is protected by an organic molecule layer that includes an alkylamine, an alkyldiamine, or an amine having another structure, in an organic solvent.

An application member that is positioned opposite to the substrate through a specific gap may be provided, and the substrate may be moved at a specific speed, or the application member may be moved parallel to the substrate while supplying a necessary amount of ink. The application member may be in the shape of a blade, a roll, or the like. It is preferable that the application member be designed to be positioned opposite to the substrate through a specific gap, and have such a structure that the ink passes through the gap, or is held within the gap. For example, when using a blade coater or a roll coater, the ink passes through a linear gap formed between the coater and the substrate due to a capillary effect or the like. The application member need not necessarily be designed so that a gap is formed between the application member and the substrate. The application member may be designed so that the ink is held by the contact area with the substrate. Specific examples of the application member include a blade coater, a roll coater, a slit coater, a die coater, a slot die coater, a capillary coater, and the like. The application member may include a structure having a slit or the like as a structure that supplies the ink.

In one embodiment of the invention, the application member that is positioned opposite to the substrate through a specific gap, or the application member that comes in contact with the substrate is moved parallel to the substrate, so that the ink that passes through the gap between the application member and the substrate, or held by the contact area with the substrate adheres to and aggregates on the pattern area, while the ink does not adhere to an area other than the pattern area.

The pattern area of the insulating film to which UV light has been applied forms the reactive surface through a photochemical reaction. The term "reactive surface" used herein refers to a state in which radical groups are produced in the surface of the insulating film (e.g., perfluororesin) through a photochemical reaction upon UV irradiation, and adhesion and aggregation of the metal nanoparticle ink easily occur. Specifically, the insulating film (e.g., resin) has a surface state in which carboxylic acids (carboxyl groups) have been produced in the same manner as in the reactive surface of the laminate, and a strong coordination bond is easily formed with a metal. The radical groups thus produced promote removal of the organic molecule layer that includes an alkylamine, an alkyldiamine, or an amine having another structure, and also promote adhesion and aggregation (fusion and aggregation) of the metal particles. Aggregates of the metal nanoparticle ink thus obtained strongly adhere to the substrate through the polymer layer.

When using a hydrophilic/hydrophobic pattern that utilizes the difference in surface energy (see Patent Document 3), adhesion of the metal nanoparticles to the surface of the substrate and aggregation of the metal nanoparticles do not occur. Therefore, it is difficult to form a fine pattern, and the aggregates of the metal nanoparticles after drying are easily removed from the surface of the substrate. Accordingly, it is difficult to use the above technique for forming a fine conductive pattern.

Note that the expression "adhesion and aggregation" or "fusion and aggregation" used herein refers to a state in which the metal nanoparticles adhere (fuse) to the substrate (insulating film) while forming aggregates.

The method for forming a conductive pattern according to one embodiment of the invention mainly includes the following steps:
(1) applying UV light to only a pattern area of an insulating film formed on a substrate (a UV irradiation step); and
(2) applying an ink prepared by dispersing metal nanoparticles in a solvent to the substrate (an applying an ink step), the surface of the metal nanoparticles being protected by an organic molecule layer that includes an alkylamine, an alkyldiamine, or an amine having another structure.

Figure 5:
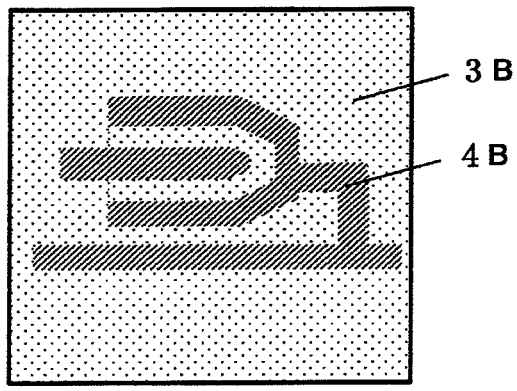
FIG. 5A, FIG. 5B, FIG. 5C are schematic views illustrating one embodiment of the invention (method for forming a conductive pattern).
Figure 5:
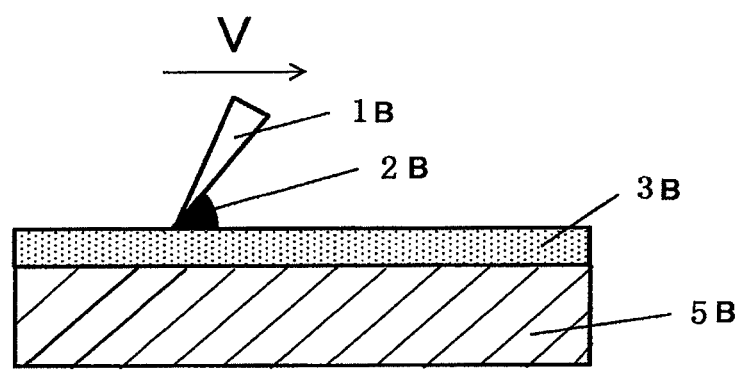
Figure 5:
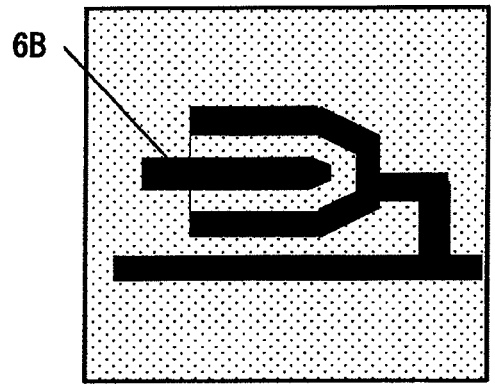

The method for forming a conductive pattern according to one embodiment of the invention is described below with reference to FIGS. 5A-5C and 6A-6C. FIGS. 5A-5C are schematic views illustrating the method for forming a conductive pattern according to one embodiment of the invention. As illustrated in FIG. 5A, UV light is applied to only a pattern area of an insulating film 3B formed on a substrate 5B to form a reactive surface 4B. As illustrated in FIG. 5B, an application member is moved relative to the insulating film 3B formed on the substrate 5B to apply an ink to the insulating film 3B. FIG. 5B illustrates a state in which a blade 1B to which an ink 2B adheres is swept in the direction indicated by the arrow at a sweep speed V. As illustrated in FIG. 5C, a conductive pattern 6B is thus formed in the pattern area having the reactive surface.

Figure 6:
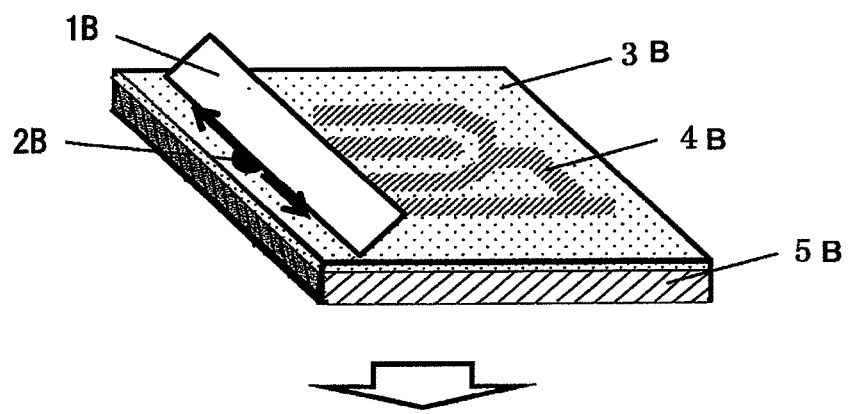
FIG. 6A, FIG. 6B, FIG. 6C are perspective views illustrating one embodiment of the invention (method for forming a conductive pattern).
Figure 6:
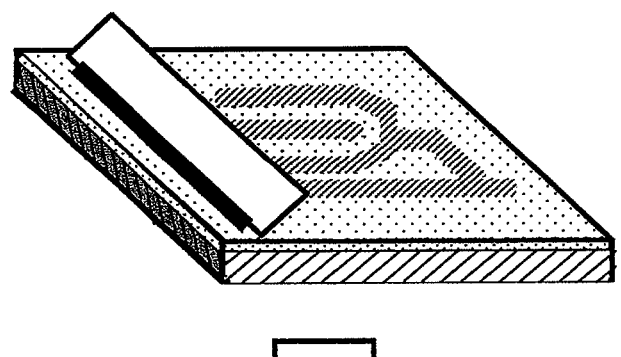
Figure 6:
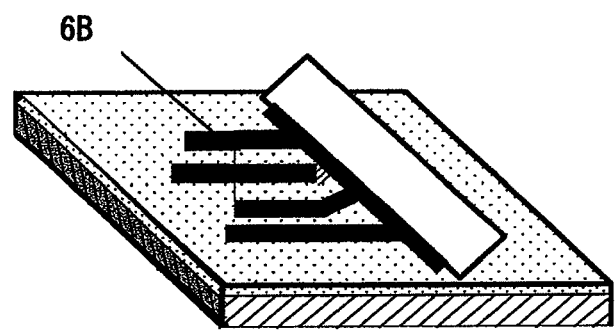

FIGS. 6A-6C are perspective views illustrating the method for forming a conductive pattern according to one embodiment of the invention taking a blade coating method as an example. FIGS. 6A-6C illustrate states when sweeping a blade 1B. The blade 1B is brought into contact with a substrate 5B on which an insulating film 3B having a reactive surface 4B (pattern area) is formed (i.e., the blade 1B is brought into contact with the insulating film 3B). When an ink 2B that includes coated metal nanoparticles is dropped onto the center of the contact area with the substrate 5B, the ink 2B spreads due to a capillary effect (FIG. 6A). After the ink 2B has spread along the blade 1B, the blade 1B is swept along the surface of the substrate 5B (FIG. 6B). The ink 2B adheres to and aggregates on only the reactive surface (pattern area) when the blade 1B is swept to form a conductive circuit pattern 6B (FIG. 6C). Since the conductive circuit pattern obtained by the method for forming a conductive pattern according to one embodiment of the invention is formed of the metal that forms the metal nanoparticles, fine metal wires can be obtained.

(UV Irradiation Step)

The lower limit and the upper limit of the UV wavelength range employed when causing a photochemical reaction to occur for forming the reactive surface are preferably 10 nm and 250 nm, respectively. For example, the C—F bond energy is about 490 kJ/mol. Therefore, it is considered that dissociation sufficiently occurs when the UV wavelength is 244 nm or less. For example, it is preferable to use vacuum ultraviolet (VUV) light. The term "vacuum ultraviolet light" or "VUV light" refers to UV light having a wavelength of about 10 nm to about 200 nm. The lower limit of the UV wavelength is more preferably 100 nm. The irradiation power (dose) is preferably about 10 mJ/cm$^2$ to about 1000 mJ/cm$^2$.

Since adhesion and aggregation of the ink occur through a radical group formed on the surface of a fluorine-based resin (e.g., perfluororesin) that forms the insulating film, the degree of fineness of the pattern (reactive surface) is determined by the degree of fineness of the photomask and the diffraction limit based on the wavelength of UV light. Therefore, it is possible to form a pattern area (reactive surface) having a line width (pitch) of 0.2 μm on the insulating film by applying VUV light for several tens of seconds or less.

UV light may be applied in a state in which a photomask that covers an area other than the pattern area is caused to adhere to the insulating film formed on the substrate. The pattern may be formed by sweeping a UV laser beam having a reduced beam diameter over the substrate. Alternatively, patterned parallel UV light may be applied to the substrate without causing a photomask to adhere to the insulating film.

The substrate may be a plastic substrate that has low heat resistance (e.g., polyethylene naphthalate (PEN), polyethylene terephthalate (PET), or polypropylene), a plastic substrate that has high heat resistance (e.g., polycarbonate), a silicon substrate, a glass substrate, or the like. It is preferable to use a plastic substrate when producing a flexible electronic device. A pulp substrate impregnated with a fluororesin may also be used.

The insulating film may be formed using a fluorine-based resin. It is preferable that the surface of the insulating film be smooth and flat. Since the insulating film must generate radicals through a photochemical reaction upon application of UV light, it is preferable to use a polymer insulating material (e.g., fluorine-based resin) that generates reactive radicals.

Examples of the fluorine-based resin include polychlorotrifluoroethylene, polyvinyl fluoride, an ethylene-chlorotrifluoroethylene copolymer, polyvinylidene fluoride, a perfluoroethylenepropene copolymer, an ethylene-tetrafluoroethylene copolymer, polytetrafluoroethylene, a perfluoroalkoxyalkane, a fluorine-based resin having a perfluoroalkyl ether ring structure, and the like.

The fluorine-based resin used to form the insulating film may be a perfluororesin. It is preferable to use a fluorine-based resin having a perfluoroalkyl ether ring structure. Examples of the fluorine-based resin having a perfluoroalkyl ether ring structure include a perfluoro(3-butenyl vinyl ether) polymer ("CYTOP (registered trademark)" manufactured by Asahi Glass Co., Ltd.), and a perfluorodimethyldioxole-tetrafluoroethylene copolymer ("Teflon (registered trademark) AF" manufactured by Dupont-Mitsui Fluorochemicals Co., Ltd.).

(Application Step)

The coated metal nanoparticles used in one embodiment of the invention are provided with an organic molecule layer (i.e., protective layer) that includes an alkylamine, an alkyldiamine, or an amine having another structure. It is considered that a number of alkylamine molecules are bonded to the metal nanoparticles through a coordination bond formed by the amino group, and the alkyl moieties aggregate on the surface of the metal nanoparticles so that the metal nanoparticles are coated with the organic molecule layer. Therefore, the weight ratio of the coating can be mainly adjusted by adjusting the molecular weight of the alkylamine.

In one embodiment of the invention, it is preferable to store and use the coated metal nanoparticles in the form of an ink dispersion prepared by dispersing the coated metal nanoparticles in an organic solvent so that the coating is not easily removed from the coated metal nanoparticles.

When using coated silver nanoparticles as the coated metal nanoparticles, the metal nanoparticles may include silver as the main component, and further include an additional metal element. The coated metal nanoparticles may be formed of copper or nickel instead of silver. The coated metal nanoparticles are nanometer-sized particles having a particle size of less than 1 μm. The average particle size of the coated metal nanoparticles is preferably 10 to 100 nm, and more preferably 10 to 30 nm.

Specific examples of the alkylamine, the alkyldiamine, or the amine having another structure that is included in the organic molecule layer with which the metal nanoparticles are coated, include medium/short-chain alkyldiamines, long/medium/short-chain alkylamines, and the like.

The structure of the medium/short-chain alkyldiamines is not particularly limited. It is preferable to use a medium/short-chain alkyldiamine in which at least one amino group is a primary amino group ($RNH_2$ (wherein R is a hydrocarbon chain)) or a secondary amino group ($R_1R_2NH$ (wherein $R_1$ and $R_2$ are independently a hydrocarbon chain)). The boiling point of the medium/short-chain alkyldiamines must be 100° C. or more taking account of the thermal decomposition temperature of the complex, and must be 250° C. or less taking account of the low-temperature sintering properties of the resulting coated metal nanoparticles. Examples of the medium/short-chain alkyldiamines include, but are not limited to, ethylenediamine, N,N-dimethylethylenediamine, N,N'-dimethylethylenediamine, N,N-diethylethylenediamine, N,N'-diethylethylenediamine, 1,3-propanediamine, 2,2-dimethyl-1,3-propanediamine, N,N-dimethyl-1,3-diaminopropane, N,N'-dimethyl-1,3-diaminopropane, N,N-diethyl-1,3-diaminopropane, 1,4-diaminobutane, 1,5-diamino-2-methylpentane, 1,6-diaminohexane, N,N'-dimethyl-1,6-diaminohexane, 1,7-diaminoheptane, 1,8-diaminooctane, and the like.

The structure of the medium/short-chain alkylamines is not particularly limited. It is preferable to use a medium/short-chain alkylamine in which the amino group is a primary amino group ($RNH_2$ (wherein R is a hydrocarbon chain)) or a secondary amino group ($R_1R_2NH$ (wherein $R_1$ and $R_2$ are independently a hydrocarbon chain)). The boiling point of the medium/short-chain alkylamines must be 100° C. or more taking account of the thermal decomposition temperature of the complex, and must be 250° C. or less taking account of the low-temperature sintering properties of the resulting coated metal nanoparticles. Examples of the medium/short-chain alkylamines include, but are not limited to, 2-ethoxyethylamine, dipropylamine, dibutylamine, hexylamine, cyclohexylamine, heptylamine, 3-butoxypropylamine, octylamine, nonylamine, decylamine, 3-aminopropyltriethoxysilane, dodecylamine, and the like.

Examples of the long/medium-chain alkylamines include, but are not limited to, dipropylamine, dibutylamine, hexylamine, cyclohexylamine, heptylamine, 3-butoxypropylamine, octylamine, nonylamine, decylamine, 3-aminopropyltriethoxysilane, dodecylamine, hexadecylamine, oleylamine, octadecylamine, and the like. A long/medium-chain alkylamine having 6 or more carbon atoms may be appropriately used depending on the objective.

Examples of the short-chain alkylamines include, but are not limited to, amylamine, 2-ethoxyethylamine, 4-methoxybutylamine, diisopropylamine, butylamine, diethylamine, propylamine, isopropylamine, ethylamine, dimethylamine, and the like.

The ink used in one embodiment of the invention includes the coated metal nanoparticles and the organic solvent. The organic solvent may be tetrachloromethane, benzene, dichlorobenzene, dichloromethane, toluene, octane, tetralin, mesitylene, butanol, methanol, or the like. The content of the coated metal nanoparticles in the ink is preferably 30 to 60 wt % based on the total weight of the ink.

The thickness of the resulting wiring pattern can be controlled within the range of 15 to 100 nm by controlling the concentration of the metal nanoparticle ink. In particular, an optimum pattern reproducibility is obtained within the thickness range of 30 to 90 nm.

Since the contact area of the application member (e.g., blade or roll) with the substrate in which the ink spreads due to a capillary effect necessarily has a shape determined by the end of the application member (i.e., a linear shape having a specific width), the thickness of the applied ink is determined by the concentration of the ink even if the line width and the shape of the pattern (reactive surface) are changed.

Therefore, a film having a specific (constant) thickness can be formed (printed) by applying an ink having a specific concentration using the application member (e.g., blade or roll), even if the line width and the shape of the pattern (reactive surface) are changed.

The ink may be applied using the application member (e.g., blade or roll) by utilizing a known coater. In order to obtain a conductive pattern in high yield, the upper limit of the sweep speed of the application member (e.g., blade) relative to the substrate is preferably set to 10 mm/sec. If the sweep speed is higher than 10 mm/sec, the ink may not sufficiently adhere to the pattern (i.e., the yield may decrease). The lower limit of the sweep speed is not particularly limited, but is practically about 0.01 mm/sec from the viewpoint of production efficiency. Since the area of the ink that covers the pattern area (reactive surface) changes corresponding to the sweep speed, it is preferable to appropriately optimize the sweep speed. For example, when the sweep speed was set to 2 mm/sec, the difference between the design value of the photomask and the printed pattern was minimized. Therefore, it is more preferable to set the sweep speed to 0.1 to 5 mm/sec.

In the application step, the thickness and the conductivity of the resulting conductive pattern can be controlled by optimizing the temperature and the humidity in addition to the sweep speed. It is preferable to perform the application step at a room temperature of 15 to 40° C.

According to the above method, it is possible to produce a conductive wiring pattern having a resistivity equal to or less than about 60 times the resistivity of a metal. In particular, the design value reproducibility of the wiring pattern is optimized by applying (printing) the ink at 25° C.

It is preferable to apply the ink at a humidity of 10 to 80%. It is more preferable to apply the ink at a humidity of 20 to 40%. In particular, the design value reproducibility of the wiring pattern is optimized by applying (printing) the ink at a humidity of 30%.

According to one embodiment of the invention, since the ink is applied (printed) while maintaining a state in which the ink spreads between the application member (e.g., blade or roll) and the substrate due to a capillary effect, the amount of the ink can be reduced. Specifically, a conductive circuit pattern can be formed by printing on the surface of a substrate having dimensions of about 1×1 m using 1 ml (minimum) of the metal nanoparticle ink.

A heat treatment may be performed at 100° C. or less (or 80° C.) after the application step. Since the heat treatment (heat treatment temperature) may adversely affect the performance of another layer or the like depending on the electronic device to be produced, the heat treatment may be appropriately omitted.

EXAMPLES

First Embodiment

A first embodiment of the invention illustrates an example in which the metal layer included in the laminate is formed by applying the metal nanoparticles. A laminate according to the first embodiment may be produced by the following steps:
(1) performing a treatment for a polymer layer formed on a substrate to have a reactive surface by applying UV light;
(2) applying an ink prepared by dispersing metal nanoparticles in a solvent to the substrate.

A method for forming a conductive pattern according to the first embodiment is described below with reference to the drawings. In the first embodiment, a conductive circuit pattern is formed as described above with reference to FIGS. 5A-5C and 6A-6C. The method for forming a conductive pattern according to the first embodiment includes (1) applying UV light to only a pattern area of an insulating film formed on a substrate (a UV irradiation step); and (2) applying an ink prepared by dispersing metal nanoparticles in a solvent to a blade, and sweeping the ink on the blade over the substrate, the surface of the metal nanoparticles being protected by an organic molecule layer that includes an alkylamine, an alkyldiamine, or an amine having another structure (an application step).

Example 1

An example in which a conductive circuit pattern was formed as a laminate is described below. In Example 1, a laminate was produced by (1) applying UV light to only a pattern area of a fluorine-based polymer layer formed on a substrate; and (2) applying an ink prepared by dispersing metal nanoparticles in a solvent to a blade, and sweeping the ink on the blade over the substrate, the surface of the metal nanoparticles being protected by an organic molecule layer that includes an alkylamine, an alkyldiamine, or an amine having another structure.

An amorphous perfluororesin ("CYTOP (registered trademark)" manufactured by Asahi Glass Co., Ltd.) was applied to a substrate (glass sheet) at 2000 rpm for 20 seconds using a spin coating method, heated at 80° C. for 10 minutes, and heated at 150° C. for 60 minutes to form an amorphous perfluororesin film (polymer layer). The amorphous perfluororesin film exhibited insulating properties and transparency, and had a thickness of 1 μm. A photomask having the desired pattern was caused to adhere to the polymer layer formed on the substrate, and VUV light (wavelength: 172 nm) was applied to the polymer layer at a power of 11 mW/cm$^{-2}$ for 20 seconds. The pattern area of the polymer layer to which UV light was applied had a reactive surface. The line width of the pattern was 5 μm (200 ppi).

A silver nanoparticle ink prepared using an oxalate-bridging silver alkylamine complex thermal decomposition method, was provided. The particle size of the silver nanoparticles was 10 to 30 nm. A protective layer (coating) was formed using an alkyldiamine. A blade was brought into contact with the substrate on which the pattern area was formed by applying UV light to part of the polymer layer, and the silver nanoparticle ink was dropped onto the center of the contact area. After the ink had spread due to a capillary effect, the blade was swept along the surface of the substrate. The sweep speed was set to 2 mm/sec. The temperature and the humidity during sweeping were 25° C. and 30%, respectively. The silver nanoparticle ink adhered to and aggregated on only the pattern area (reactive surface) as a result of sweeping the blade along the surface of the substrate. After applying the silver nanoparticle ink, the silver nanoparticle ink was allowed to dry. The resulting conductive pattern had a line width of 6 μm, a length of 500 μm, and a thickness of 0.0322 μm. The conductive pattern had a resistance of 1303Ω and a volume resistivity of 5.00×10$^{-5}$ Ω·cm.

Examples 2 to 6

A conductive circuit pattern was formed in the same manner as in Example 1, except that the pattern area was designed to have a line width differing from that of Example 1. Table 1 shows the results of Examples 1 to 6.

TABLE 1

|  | Line width (design value) [μm] | Line width (measured value) [μm] | Length [μm] | Thickness [μm] | Resistance [Ω] | Volume resistivity [Ω·cm] |
|---|---|---|---|---|---|---|
| Example 1 | 5 | 6 | 500 | 0.0322 | 1303 | 5.00E−05 |
| Example 2 | 10 | 11 | 500 | 0.0367 | 698 | 5.60E−05 |
| Example 3 | 20 | 20 | 500 | 0.0328 | 615 | 8.10E−05 |
| Example 4 | 50 | 50 | 500 | 0.0255 | 17.5 | 4.46E−06 |
| Example 5 | 30 | 30 | 500 | 0.0462 | 29.0 | 8.03E−06 |
| Example 6 | 30 | 30 | 500 | 0.0918 | 71.5 | 3.94E−05 |

The silver conductive circuit patterns obtained in Examples 1 to 6 had a volume resistivity of about 4.46 E−06 to 8.10 E−05 Ω·cm, which is equal to or less than about 3 to 55 times the bulk volume resistivity (1.47 E−6 Ω·cm) of silver. It was thus confirmed that the conductive circuit patterns obtained in Examples 1 to 6 had high conductivity. In Examples 1 to 3, the ink concentration was set to 40%. In Examples 4 to 6, the ink concentration was changed from 40% to 55%. Therefore, the conductive circuit patterns obtained in Examples 1 to 3 had an almost identical thickness, and the conductive circuit patterns obtained in Examples 4 to 6 showed an increase in thickness corresponding to the ink concentration.

The conductive patterns (conductive pattern films) obtained in Examples 1 to 6 were analyzed using a scanning electron micrograph (SEM image), and it was found that the silver particles having an average particle size of about 10 to 30 nm uniformly adhered to the pattern area at a high density.

Figure 3:
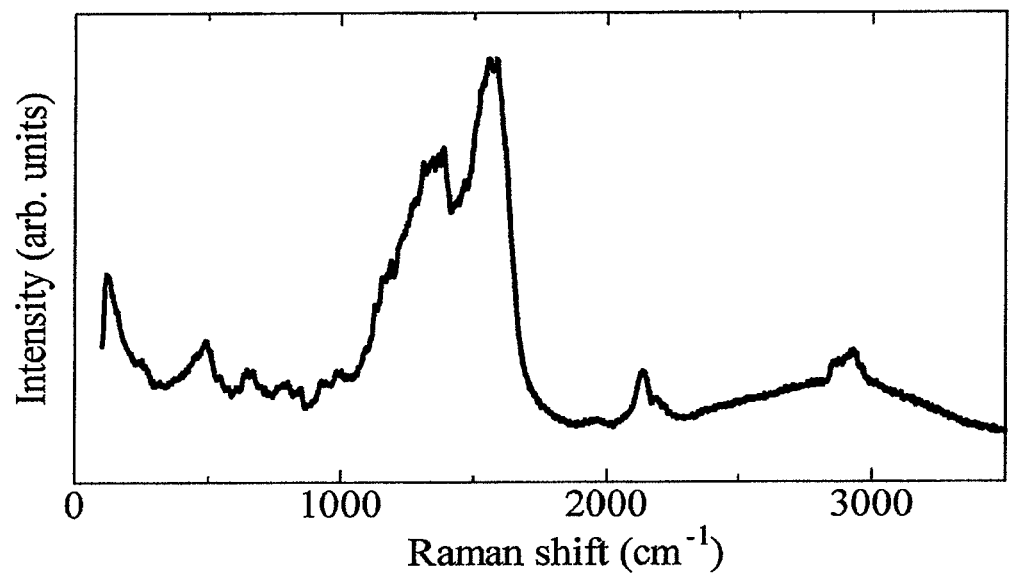
FIG. 3 is a view showing a Raman spectrum (first embodiment).

The bonding state of the silver layer formed by applying the silver nanoparticle ink and the reactive surface of the polymer layer was analyzed based on the measurement results obtained by microscopic Raman spectroscopy, X-ray photoelectron spectroscopy, and electron spin resonance spectroscopy. FIG. 3 illustrates the results obtained by applying laser light (532 nm) to the silver layer (film) of Example 1 formed by applying the silver nanoparticle ink through the substrate, and measuring the Raman spectrum from the interface between the silver layer and the polymer layer. A chemical species bonded directly to the metal can be clearly observed due to a surface enhancement effect in the vicinity of the surface of the metal layer. In the Raman spectrum, a vibrational structure attributed to the alkylamine group that was initially bonded to the nanoparticles disappeared, and a vibrational structure attributed to a chemical species differing from the alkylamine group was observed. A vibrational structure attributed to COO was observed at around 1370 cm$^{-1}$ and 1570 cm$^{-1}$. It was thus confirmed that the alkylamine groups left the silver nanoparticles at the interface with the reactive surface, and COO formed in the reactive surface was bonded directly to the silver nanoparticles.

The inventor found based on the above results that a strong chemical bond that utilizes a bond between silver and a carboxylic acid ion can be formed between a fluorine-based polymer layer and a silver thin film. Therefore, it is possible to form a metal layer that is very strongly bonded to a substrate. It is also possible to strongly bond a metal layer other than a silver layer and a polymer layer by chemically bonding COO derived from a carboxylic acid (carboxyl group) that extends from the polymer main chain included in the polymer layer to the metal atom included in the metal layer. It is considered that COO derived from the carboxylic acid (carboxyl group) and the metal atom included in the metal layer form a metal carboxylate.

Since adhesion and aggregation of the ink occur through a radical group formed on the surface of a fluorine-based resin (e.g., perfluororesin), the degree of fineness of the pattern (reactive surface) is determined by the degree of fineness of the photomask and the diffraction limit based on the wavelength of UV light. Therefore, it is possible to form a pattern area (reactive surface) having a line width (pitch) of 0.2 μm on the polymer layer by applying VUV light for several tens of seconds or less.

(Measurement of Peel Strength)

The peel strength of each laminate was determined. The peel strength of each laminate was measured using a PULL-OFF test (ISO 4624). When the metal nanoparticles were applied to the reactive surface of the polymer layer formed on the surface of the substrate by applying UV light, adhesion between the metal layer (metal thin film) and the substrate was very strong, and separation (peeling) of the metal layer was not observed. The substrate broke at 5.6 kg/cm$^2$ during the peel strength measurement (ISO 4624). It was thus confirmed that the peel strength between the metal layer (metal thin film) and the substrate was 5.6 kg/cm$^2$ or more.

Comparative Example 1

In Comparative Example 1, the metal nanoparticles were applied to the substrate to which UV light was not applied, and the peel strength of the resulting laminate was measured using a PULL-OFF test (ISO 4624). As a result, a metal mass formed by the metal nanoparticles that adhered to each other was separated, and the peel strength was equal to or less than the detection limit (0.0 kg/cm$^2$ or less).

Example 7

Figure 7:
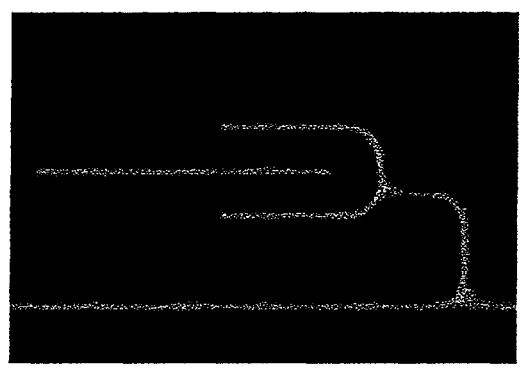
FIG. 7A, FIG. 7B are views showing an optical micrograph of a conductive circuit pattern (first embodiment).
Figure 7:
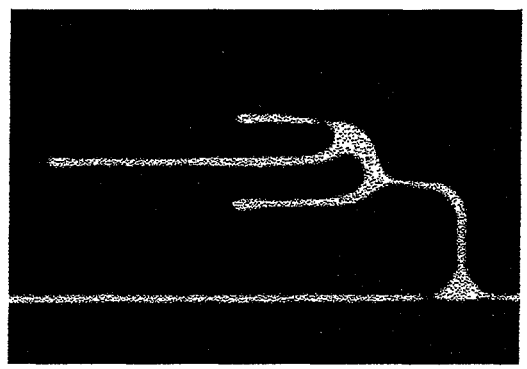

A conductive pattern was formed in the same manner as in Example 1. VUV light (wavelength: 172 mu) was applied at a power of 11 mW/cm$^{-2}$ for 20 seconds. The pattern area of the insulating film to which UV light was applied had a reactive surface. A photomask having a line width of 5 pm (design value: 200 ppi) was used. The blade sweep step was performed at a low sweep speed of 2 mm/sec. The effects of temperature were determined by changing the temperature during the sweep step. FIGS. 7A and 7B show optical micrographs of the resulting conductive pattern. FIG. 7A indicates the case where the temperature was set to 30° C., and FIG. 7B indicates the case where the temperature was set to 7° C. When the temperature was set to 30° C., a fine metal electrode wiring pattern (conductive circuit pattern) corresponding to the pattern of the photomask was formed (FIG. 7A). When the temperature was set to 7° C., some of the wires were connected to each other, and a missing part was observed (FIG. 7B). It is considered preferable to set the temperature to 15 to 40° C. in order to form a fine conductive circuit pattern. Since the optimum sweep conditions differ depending on the sweep speed, the humidity, and the like, it is preferable to appropriately optimize the sweep conditions corresponding to the sweep speed, the humidity, the temperature, and the ink concentration.

Example 8

Figure 8:
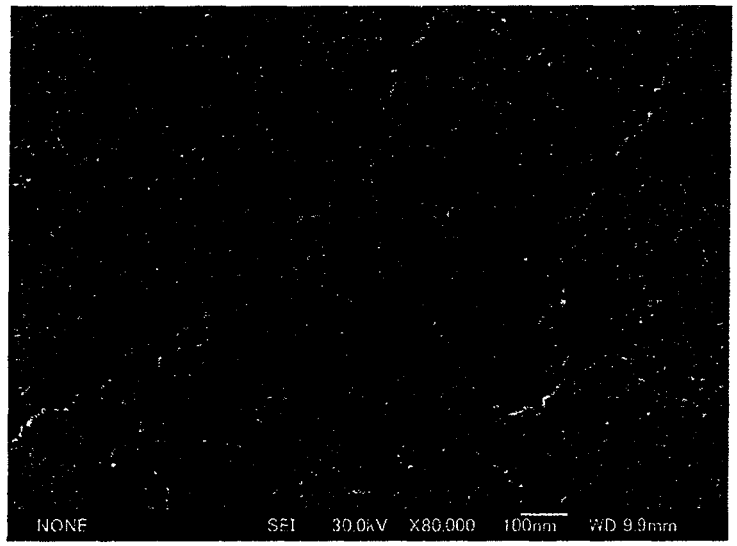
FIG. 8A is a SEM image of a conductive film (SEM image when a spin coating method was used)
FIG. 8B is a SEM image of a conductive film (SEM image when a blade coating method was used).
Figure 8:
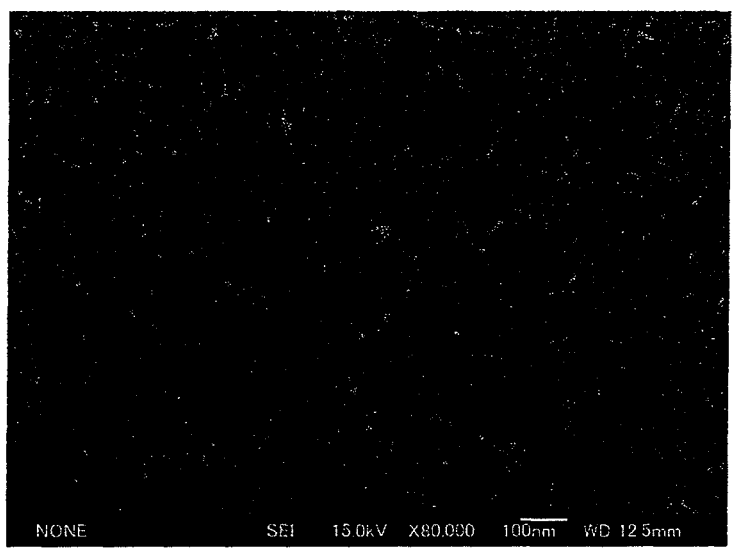

A conductive pattern was formed in the same manner as in Example 1. FIG. 8A is a scanning electron micrograph (SEM image) of the resulting conductive pattern (blade coating film). It was found that the silver particles having an average particle size of about 10 to 30 nm uniformly adhered to the pattern area at a high density.

Comparative Example 2

An ink prepared by dispersing silver nanoparticles of which the surface was protected by an organic molecule layer (including an alkylamine, an alkyldiamine, or an amine having another structure) in a solvent was applied using a spin coating method to form a conductive film. FIG. 8A is a scanning electron micrograph (SEM image) of the resulting conductive film (spin coating film). As illustrated in 8A, the silver particles were non-uniformly distributed, and fissures were observed.

It was thus confirmed that the blade coating film obtained in Example 8 had a structure in which the silver nanoparticles having a uniform particle size were uniformly distributed (i.e., exhibits improved conductivity) as compared with the spin coating film (FIGS. 8A and 8B).

The laminate was subjected to Raman spectrum measurement. It was found that the reactive surface included COO derived from carboxylic acids (carboxyl groups) produced through generation of radicals due to a photochemical reaction upon UV irradiation, and a metal carboxylate was formed at the interface with the metal nanoparticle layer.

Since the conductive circuit pattern obtained in Example 8 was formed of the metal forming the metal nanoparticles, fine metal wires could be obtained.

Although an example in which the line width (measured value) of the pattern was 5 μm has been described above, a fine conductive circuit having a minimum line width (pitch) of 0.2 μm can be formed as a conductive circuit pattern using only a coating method by further reducing the line width of the photomask.

The thickness of the resulting wiring pattern can be controlled within the range of 15 to 100 nm by controlling the concentration of the metal nanoparticle ink. In particular, an optimum pattern reproducibility is obtained within the thickness range of 30 to 90 nm. According to the first embodiment, it is possible to produce a conductive wiring pattern having a resistivity equal to or less than about 60 times the resistivity of a metal.

Second Embodiment

A second embodiment of the invention illustrates an example in which a semiconductor device is produced using the method for forming a conductive pattern described above in connection with the first embodiment. An amorphous perfluororesin ("CYTOP (registered trademark)") is applied to a silicon substrate using a spin coating method in the same manner as in Example 1. A photomask having a pattern for forming electrodes (drain and source) of a semiconductor device is provided on the resulting insulating film, and VUV light is applied to the insulating film. An ink prepared by dispersing silver nanoparticles of which the surface is protected by an organic molecule layer (including an alkylamine, an alkyldiamine, or an amine having another structure) in a solvent is applied to a blade, and the blade is swept along the substrate to form an electrode pattern. An organic semiconductor layer (e.g., pentacene layer) is formed on the insulating film and the electrodes formed on the substrate. The subsequent steps are performed in the same manner as in a known organic transistor device production process.

According to the second embodiment, a semiconductor device in which the volume resistivity of the conductive pattern was the same as that of Example 1 could be produced using a silicon substrate as the substrate.

Third Embodiment

A third embodiment of the invention illustrates an example in which the metal layer included in the laminate is formed using a vacuum evaporation method. A laminate according to the third embodiment may be produced by the following steps:
(1) performing a treatment for a polymer layer formed on a substrate to have a reactive surface by applying UV light (a treatment step); and
(2) evaporating a metal on the substrate subjected to the treatment step (a metal thin film-forming step).

In the third embodiment, the treatment step was performed in the same manner as in the first embodiment. Silver (solid) was disposed on a tungsten boat placed in a vacuum chamber ($10^{-5}$ Torr or less), and the tungsten boat was heated by applying current to melt and evaporate the silver to form a silver thin film layer on the substrate.

Figure 4:
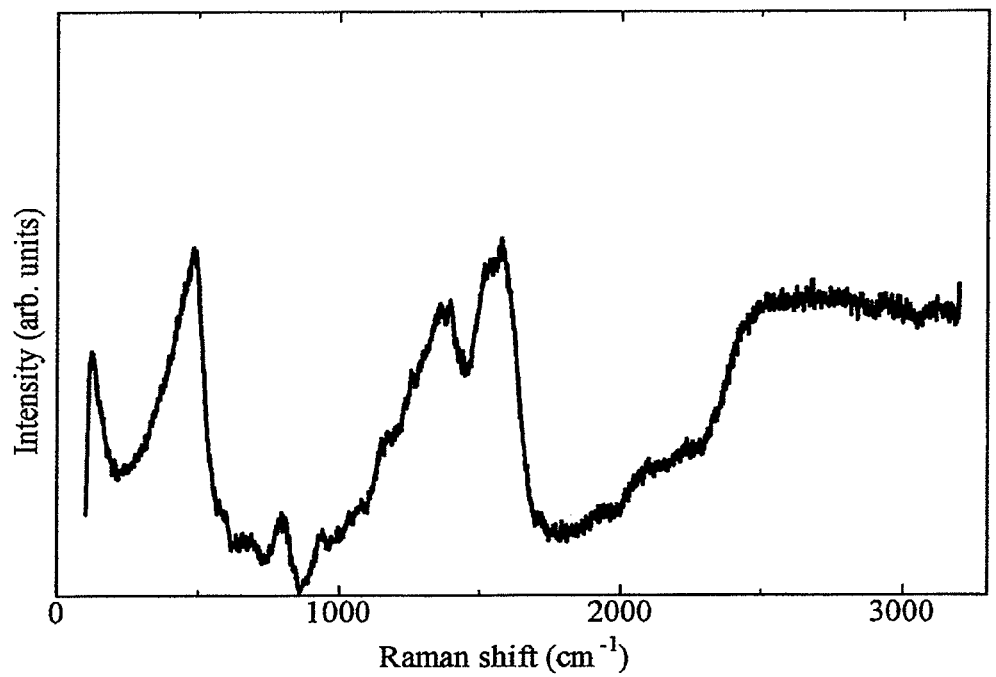
FIG. 4 is a view showing a Raman spectrum (third embodiment).

The bonding state of the silver evaporated layer and the reactive surface of the polymer layer was analyzed based on the measurement results obtained by microscopic Raman spectroscopy, X-ray photoelectron spectroscopy, and electron spin resonance spectroscopy. FIG. 4 is the results obtained by applying laser light (532 nm) to the silver evaporated layer through the substrate, and measuring the Raman spectrum from the interface between the silver layer and the polymer layer. A chemical species bonded directly to the metal can be clearly observed due to a surface enhancement effect in the vicinity of the surface of the metal layer. In the Raman spectrum illustrated in FIG. 4, a vibrational structure attributed to COO was observed at around 1370 $cm^{-1}$ and 1570 $cm^{-1}$. It was thus confirmed that COO formed in the reactive surface was bonded directly to the silver evaporated layer at the interface with the reactive surface.

The silver evaporated layer was not separated when subjected to peel strength measurement in the same manner as in the case of applying the silver nanoparticle ink.

Fourth Embodiment

Figure 9:
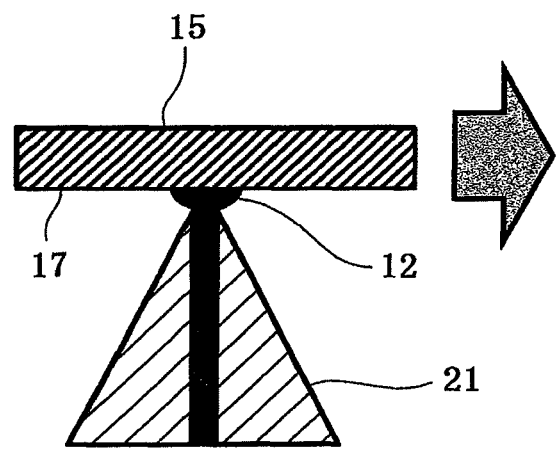
FIG. 9A is a schematic view illustrating a fourth embodiment of the invention (capillary coating operation according to the fourth embodiment)
FIG. 9B is a schematic view illustrating a fifth embodiment of the invention (roll coating operation according to the fifth embodiment).
Figure 9:
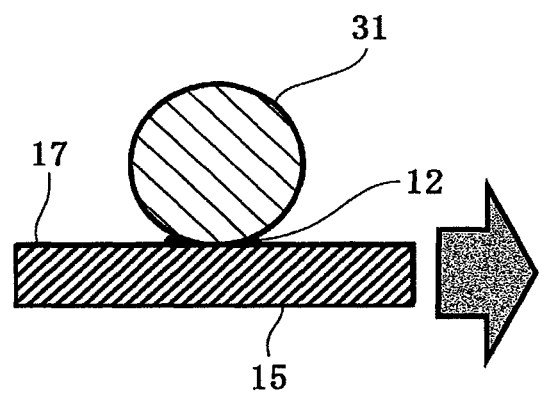

A method for forming a conductive pattern according to a fourth embodiment of the invention is described below with reference to FIGS. 5A-5C, 6A-6C, 9A, and 10A. In the fourth embodiment, a capillary coater 21 is used as the application member (see FIGS. 5A-5C), differing from the first embodiment. A schematic view illustrating a capillary coating operation according to the fourth embodiment is illustrated in FIG. 9A. The capillary coater 21 is brought into contact with (or brought close to) the substrate surface 17 (hereinafter may be referred to as "application surface") on which a pattern area is formed by applying UV light to part of an insulating film. A metal nanoparticle ink 12 is supplied to the contact area from a slit provided to the capillary coater 21 (FIG. 9A). After the ink has spread through the gap between the capillary coater 21 and the substrate surface 17 due to a capillary effect, the capillary coater 21 is swept along the substrate surface 17. The thick arrow in FIGS. 9A and 9B indicate the moving direction relative to the coater or the substrate surface. A slot coater, a slit coater, a die coater, a slot die coater, or the like may be used instead of a capillary coater.

The method for forming a conductive pattern according to the fourth embodiment includes (1) applying UV light to only a pattern area of an insulating film formed on a substrate (a UV irradiation step), and (2) applying an ink prepared by dispersing metal nanoparticles in a solvent to the substrate using a capillary coater, the surface of the metal nanoparticles being protected by an organic molecule layer that includes an alkylamine, an alkyldiamine, or an amine having another structure (an application step).

The method for forming a conductive pattern according to the fourth embodiment is described below by way of an example.

Example 9

An amorphous perfluororesin ("CYTOP (registered trademark)") was applied to a substrate (glass sheet) using a spin coating method in the same manner as in Example 1. The applied amorphous perfluororesin was heated to form an amorphous perfluororesin film. The amorphous perfluororesin film (insulating film) exhibited insulating properties and transparency, and had a thickness of 1 μm or less. A photomask having the desired pattern was caused to adhere to the insulating film formed on the substrate, and VUV light (wavelength: 172 nm) was applied to the insulating film at a power of 11 mW/cm$^{-2}$ for 20 to 80 seconds. The pattern area of the insulating film to which UV light was applied had a reactive surface. The pattern consisted of two square areas and a linear area that connects the two square areas. The design line width of the pattern was 5 μm (200 ppi).

A silver nanoparticle ink similar to that used in Example 1 was provided. The particle size of the silver nanoparticles was 10 to 30 nm. A protective layer (coating) was formed using an alkyldiamine. The silver nanoparticle ink was brought into contact with the substrate (on which the pattern area was formed by applying UV light to part of the insulating film) by supplying it from a slit provided to a capillary coater so that it spread in the gap between the capillary coater and the substrate due to a capillary effect. The capillary coater was swept along the surface of the substrate while continuously supplying the silver nanoparticle ink to the contact area from the slit provided to the capillary coater (FIG. 9A). The sweep speed was set to 2 mm/sec. The temperature and the humidity during sweeping were 25° C. and 30 to 40%, respectively. The silver nanoparticle ink adhered to and aggregated on only the pattern area (reactive surface) after the capillary coater had been swept along the surface of the substrate (FIG. 6C). After applying the silver nanoparticle ink, the silver nanoparticle ink was allowed to dry. The resulting conductive pattern had a line width of 6 μm.

FIG. 10A is an optical micrograph of the resulting conductive circuit pattern. The white area in FIG. 10A is the conductive circuit pattern. A fine electrode metal wiring pattern (conductive circuit pattern (two square areas and a linear area that connects the two square areas)) corresponding to the pattern of the photomask could be formed.

Fifth Embodiment

A method for forming a conductive pattern according to a fifth embodiment of the invention is described below with reference to FIGS. 5A-5C, 6A-6C, 9B, and 10B. In the fifth embodiment, a roll 31 is used as the application member (see FIG. 5), differing from the first embodiment. A schematic view illustrating a roll coating operation according to the fifth embodiment is shown in FIG. 9B. The roll 31 is brought into contact with (or brought close to) a substrate surface 17 on which a pattern area is formed by applying UV light to part of an insulating film. A metal nanoparticle ink 12 is supplied to the contact area (FIG. 9B). After the ink has spread through the gap (or the contact area) between the roll 31 and the substrate surface 17 due to a capillary effect, the roll 31 is rotated to apply the ink to the substrate surface 17. The ink may be supplied to the roll using a known method.

The method for forming a conductive pattern according to the fifth embodiment includes (1) applying UV light to only a pattern area of an insulating film formed on a substrate (a UV irradiation step); and (2) applying an ink prepared by dispersing metal nanoparticles in a solvent to the substrate using a roll, the surface of the metal nanoparticles being protected by an organic molecule layer that includes an alkylamine, an alkyldiamine, or an amine having another structure (an application step). The method for forming a conductive pattern according to the fifth embodiment is described below by way of an example.

Example 10

An amorphous perfluororesin ("CYTOP (registered trademark)") was applied to a substrate (glass sheet) using a spin coating method in the same manner as in Example 1. The applied amorphous perfluororesin was heated to form an amorphous perfluororesin film. The amorphous perfluororesin film (insulating film) exhibited insulating properties and transparency, and had a thickness of 1 μm. A photomask having the desired pattern was caused to adhere to the insulating film formed on the substrate, and VUV light (wavelength: 172 nm) was applied to the insulating film at a power of 11 mW/cm$^{-2}$ for 20 to 80 seconds. The pattern area of the insulating film to which UV light was applied had a reactive surface. The pattern consisted of two square areas and a linear area that connects the two square areas. The design line width of the pattern was 5 μm (200 ppi).

A silver nanoparticle ink similar to that used in Example 1 was provided. The particle size of the silver nanoparticles was 10 to 30 nm. A protective layer (coating) was formed using an alkyldiamine. The roll 31 was brought into contact with (or brought close to) the substrate on which the pattern area was formed by applying UV light to part of the insulating film. The metal nanoparticle ink was supplied to the contact area (FIG. 9B). After the ink had spread through the contact area between the roll and the substrate due to a capillary effect, the roll was rotated to apply the ink to the surface of the substrate. The silver nanoparticle ink adhered to and aggregated on only the pattern area (reactive surface) formed on the substrate (FIG. 6C). After applying the silver nanoparticle ink, the silver nanoparticle ink was allowed to dry. The resulting conductive pattern had a line width of 6 μm.

FIG. 10B is an optical micrograph of the resulting conductive pattern. The white area in FIG. 10B is the conductive circuit pattern. A fine electrode metal wiring pattern (conductive circuit pattern (two square areas and a linear area that connects the two square areas)) corresponding to the pattern of the photomask could be formed.

Although an example in which the line width (measured value) of the pattern was 6 μm has been described above, a fine conductive circuit having a minimum line width of 0.2 μm can be formed as a conductive circuit pattern using only a coating method by further reducing the line width of the photomask.

Since the laminate according to the embodiments of the invention has a configuration in which the metal layer strongly adheres to the substrate, the laminate according to the embodiments of the invention may be applied to various laminate structures that include a metal layer in addition to electrical products. For example, the laminate according to the embodiments of the invention may be applied to daily commodities for which an antibacterial function is useful (e.g., mirror, bathroom furnishings, toilet things, desk, chair, mouse, and keyboard).

The conductive pattern according to the embodiments of the invention may be applied to an electrode and a wiring pattern of various electronic devices in addition to semiconductor devices.

The examples described above in connection with the embodiments and the like are for illustrative purposes only, and the invention is not limited to the above examples.

The invention can provide a laminate in which separation of a metal layer does not occur, and may suitably be applied to formation of metal wires of various electronic parts such as semiconductor devices, and a laminate that includes a metal layer. Therefore, the invention is industrially applicable.

According to the invention, a fine conductive pattern having a low volume resistivity can be formed by a simple coating method using a metal nanoparticle ink. Therefore, the invention may suitably be applied to formation of metal wires of various electronic parts (e.g., semiconductor devices) for which an increase in area and degree of fineness has been desired.

This application claims benefit of priority based on Japanese Patent Applications filed previously by the applicant, namely, Japanese Patent Application Nos. 2013-045173 (filing date: Mar. 7, 2013), Japanese Patent Application Nos. 2013-177676 (filing date: Aug. 29, 2013), Japanese Patent Application Nos. 2013-186922 (filing date: Sep. 10, 2013), the contents of which are herein incorporated by reference.

JP-A-2010-265543 and JP-A-2012-162767 are incorporated herein by reference in their entirety.

What is claimed is:

1. A method for forming a conductive pattern comprising:
    preparing an ink by dispersing metal nanoparticles in a solvent;
    applying UV light to a pattern area of an insulating film formed on a substrate to form a reactive surface; and subsequently
    applying the ink to the substrate to effect adhesion and aggregation of the ink on the reactive surface, wherein adhesion and aggregation means that the metal nanoparticles fuse to the substrate via coordination bond formation between the metal nanoparticle ink and the substrate while concurrently forming aggregates,
    wherein a surface of the metal nanoparticles being protected by an organic molecule layer including an alkylamine, an alkyldiamine, or an amine having another structure,
    whereby due to the method not being affected by surface energy of droplets of the ink, a conductive pattern with a uniform film thickness is obtained.

2. The method for forming a conductive pattern according to claim 1, wherein the ink is applied using an application member that holds the ink in a gap or a contact area with the substrate.

3. The method for forming a conductive pattern according to claim 1, wherein the ink is applied using a blade.

4. The method for forming a conductive pattern according to claim 1, wherein the ink is supplied to the substrate through a slit-like discharge mechanism provided to an application member.

5. The method for forming a conductive pattern according to claim 1, wherein the ink is applied using a roll.

6. The method for forming a conductive pattern according to claim 1, wherein the insulating film is formed of a fluorine-based resin.

7. The method for forming a conductive pattern according to claim 1, wherein the reactive surface is a surface in which radicals have been generated through a photochemical reaction.

8. The method for forming a conductive pattern according to claim 1, wherein the metal nanoparticles are formed of silver.

* * * * *